United States Patent
Yamazawa et al.

(10) Patent No.: US 7,960,088 B2
(45) Date of Patent: Jun. 14, 2011

(54) PHOTOSENSITIVE RESIN FOR FLEXOGRAPHIC PRINTING PLATE

(75) Inventors: Kazuyoshi Yamazawa, Fuji (JP); Katsuya Nakano, Fuji (JP); Yoshifumi Araki, Fuji (JP); Takeshi Aoyagi, Fuji (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 742 days.

(21) Appl. No.: 11/628,948

(22) PCT Filed: Jun. 9, 2005

(86) PCT No.: PCT/JP2005/010577
§ 371 (c)(1),
(2), (4) Date: Dec. 8, 2006

(87) PCT Pub. No.: WO2005/121896
PCT Pub. Date: Dec. 22, 2005

(65) Prior Publication Data
US 2008/0254385 A1    Oct. 16, 2008

(30) Foreign Application Priority Data
Jun. 11, 2004 (JP) .................... 2004-174484

(51) Int. Cl.
G03F 7/00 (2006.01)
G03F 7/26 (2006.01)
B32B 25/12 (2006.01)
B29C 45/14 (2006.01)

(52) U.S. Cl. .......... 430/270.1; 430/286.1; 526/335; 522/110; 264/171.24; 264/259; 264/331.13

(58) Field of Classification Search .......... 430/286.1, 430/302, 270.1; 526/335; 522/110
See application file for complete search history.

(56) References Cited

U.S. PATENT DOCUMENTS

| | | | | |
|---|---|---|---|---|
| 4,045,231 A | | 8/1977 | Toda et al. | |
| 4,686,172 A | * | 8/1987 | Worns et al. | 430/286.1 |
| 4,792,584 A | * | 12/1988 | Shiraki et al. | 524/77 |
| 4,804,353 A | * | 2/1989 | Wenman | 474/152 |
| 4,970,037 A | * | 11/1990 | Kafka et al. | 264/101 |
| 5,135,827 A | * | 8/1992 | Bohm et al. | 430/30 |
| 5,804,353 A | * | 9/1998 | Cushner et al. | 430/306 |
| 5,948,594 A | * | 9/1999 | Dudek et al. | 430/273.1 |
| 6,025,098 A | * | 2/2000 | Sakurai et al. | 430/18 |
| 7,029,825 B2 * | | 4/2006 | Yokota et al. | 430/281.1 |
| 2002/0037965 A1* | | 3/2002 | Kinoshita et al. | 525/127 |
| 2005/0245682 A1* | | 11/2005 | Ikeda | 525/89 |
| 2006/0167168 A1* | | 7/2006 | Suzuki et al. | 524/505 |
| 2006/0189755 A1* | | 8/2006 | Chino et al. | 525/88 |
| 2006/0263715 A1* | | 11/2006 | Tsubaki et al. | 430/270.1 |

FOREIGN PATENT DOCUMENTS

| | | |
|---|---|---|
| EP | 1209524 A1 * | 5/2002 |
| EP | 1 251 400 A2 | 10/2002 |
| JP | 52-503 | 1/1977 |
| JP | 6-39547 | 5/1994 |
| JP | 2635461 | 4/1997 |
| JP | 10-73921 | 3/1998 |
| JP | 11-153865 | 6/1999 |
| JP | 2000-155418 | 6/2000 |
| JP | 2000-181060 | 6/2000 |
| JP | 2002-519465 | 7/2002 |
| JP | 2004-246247 | 9/2004 |
| WO | WO 01/90818 A1 | 11/2001 |

OTHER PUBLICATIONS

Office Action dated Jul. 7, 2008 in corresponding Canadian application.
Office Action in corresponding EP Application No. 05 748 897.5 - 1226 dated Dec. 28, 2010.

* cited by examiner

*Primary Examiner* — Cynthia H Kelly
*Assistant Examiner* — Chanceity N Robinson
(74) *Attorney, Agent, or Firm* — Finnegan, Henderson, Farabow, Garrett & Dunner, L.L.P.

(57) ABSTRACT

Disclosed is a photosensitive resin composition for flexographic printing plates containing a thermoplastic elastomer (A), a polymer (B) mainly composed of butadiene, a photopolymerizable unsaturated monomer (C) and a photopolymerization initiator (D) (which composition substantially contains no hydrophilic polymers). In this photosensitive resin composition for flexographic printing plates, the number average molecular weight of the polymer (B) is not less than 10,000 and not more than 60,000, and the 1, 2 vinyl content in the total double bonds of the polymer (B) is not more than 25%.

13 Claims, No Drawings

PHOTOSENSITIVE RESIN FOR FLEXOGRAPHIC PRINTING PLATE

TECHNICAL FIELD

The present invention relates to a photosensitive resin composition for flexographic printing plates used in flexography.

BACKGROUND ART

Photosensitive resin structures for flexographic printing plates are, as described in Patent Documents 1, 2 and 3, for example, generally ones in which a photosensitive layer composed of a photosensitive resin composition containing a thermoplastic elastomer, at least one photopolymerizable unsaturated compound and at least one initiator sensitive to radiation is provided on a support such as a polyester film. Further optionally, for the purpose of smoothing the contact with a negative film, a slipping layer, a protective layer or a thin layer referred to as an ultraviolet blocking layer containing an infrared-sensitive substance which allows to be cut off by an infrared laser is often provided on the photosensitive layer. Making flexographic printing plates from such photosensitive resin structures for flexographic printing plates generally involves: first subjecting the whole surface of such a resin structure to ultraviolet exposure through a support (back exposure) to provide a thin uniform cured layer; then subjecting the surface of a photosensitive resin layer to image exposure by ultraviolet rays (relief exposure) through a negative film or directly on an ultraviolet blocking layer; washing out unexposed parts with a solvent for development, or making an absorbing layer absorb and remove unexposed parts after heating and melting; and obtaining desired images, i.e. relief images to make printing plates.

The printing system using a photosensitive resin plate for flexography is one in which an ink is supplied on the surfaces of convex parts of the resin plate having concaves and convexes by an ink-supplying roll, etc., and the resin plate is then made to contact with a substrates to transfer the ink on the convex surfaces to the material to be printed on.

Such a flexography has a problem that a desired printed matter cannot be obtained if the image reproducibility decreases, namely, if a favorable convex line (fine line) shoulder shape and sufficiently deep concave lines cannot be obtained.

Further, the flexography has a problem that plate relief parts chip off because the plate contacts many times with an ink supplying roll and substrates, and because ink stains accumulated on the printing plate are wiped off with a cloth, etc. to remove the stains.

Since when the thickness of a printing plate is uneven, deformations in images are generated because parts where ink has not been transferred are generated and because the pressure at printing becomes excessive, the thickness is desirably as uniform as possible. Since if a photosensitive resin structure generates cold flow during storage and transport, the thickness partially decreases, it preferably has a cold flow resistance as high as possible.

As such photosensitive resin structures, those described in Patent Documents 1, 2 and 3 are known, any of which uses a polymer of butadiene of from several hundreds to less than 10,000 in number-average molecular weight (Mn) as a plasticizer.

Patent Document 4 describes a photosensitive elastomer composition containing a high-molecular weight elastomer diene polymer and a low-molecular weight diene polymer of about 1,000 to 25,000 in molecular weight Mn. It specifically discloses a polyisoprene of 16,000 in molecular weight and a polybutadiene of not more than 4,000 in molecular weight.

Patent Document 5 describes a photo-curable polymer composition containing a low-molecular weight block copolymer (c) of 1,000 to 35,000 in weight-average molecular weight having one block A derived from a polymerizable monovinyl aromatic monomer and at least one block B derived from a polymerizable conjugated diene monomer. Besides that, Patent Document 5 exemplifies a polybutadiene as a commonly used plasticizer, whose molecular weight is 300 to 35,000. However, it describes that since the low-molecular weight block copolymer (c) functions as a plasticizer, not using the plasticizer is preferable, and examples therein use only a styrene-isoprene copolymer of 30,000 in molecular weight as the block copolymer (c).

Further, although Patent Document 6 proposes addition of an isoprene polymer of not less than 25,000 in molecular weight as a plasticizer for improving the solvent resistance of a flexographic printing plate, isoprene does not always provide a sufficient printing durability, a favorable image reproducibility of a fine line relief shape and reverse fine lines, and excellent printed matters.

As described above, in conventional arts, no examples using a liquid polybutadiene which is highly polymerized to not less than 10,000 and which has 1,2-vinyl of not more than a specific content or a sharp molecular weight distribution for a photosensitive resin composition for flexography have been known. A problem of improving both the cold flow resistance and the durability (chipping resistance) of printing plates at printing, and the image reproducibility, which are mutually conflicting effects, has not also been solved so far.

Patent Document 1: JP-A-2000-155418
Patent Document 2: JP-A-2000-181060
Patent Document 3: JP-A-11-153865
Patent Document 4: JP-B-06-039547
Patent Document 5: JP-A-2002-519465
Patent Document 6: Japanese Patent No. 2635461

DISCLOSURE OF THE INVENTION

Problem to be Solved by the Invention

The present invention has an object to provide a photosensitive resin composition for flexographic printing plates which simultaneously satisfies cold flow resistance (shape maintenability) of a photosensitive resin structure, a high image reproducibility of printing plates and a high printing durability. For improving the cold flow resistance and the durability (defect resistance) of printing plates at printing, since the physical strength of a resin composition is generally raised, the image reproducibility decreases. To exhibit both these mutually conflicting properties without decreasing the image reproducibility is a problem of the present invention.

Means for Solving the Problem

As a result of extensive studies to solve the above-mentioned problems, the present inventors have found that the use of a novel photosensitive resin composition described below can solve the problems. This finding has led to the achievement of the present invention.

Specifically, the present invention is as follows.
(1) A photosensitive resin composition for flexography, comprising a thermoplastic elastomer (A), a polymer (B) comprising butadiene as a main component, a photopolymerizable unsaturated monomer (C) and a photopolymerization initiator (D), wherein the polymer (B) has a number-average molecular weight of not less than 10,000 and not more than 60,000 and a 1,2-vinyl content based on the total amount of double bonds in the polymer (B) of not more than 25%, provided that said composition comprises substantially no hydrophilic polymer;

(2) A photosensitive resin composition for flexography, comprising a thermoplastic elastomer (A), a polymer (B) comprising butadiene as a main component, a photopolymerizable unsaturated monomer (C) and a photopolymerization initiator (D), wherein the polymer (B) has a number-average molecular weight of not less than 10,000 and not more than 60,000 and a ratio of the weight-average molecular weight to the number-average molecular weight thereof of not more than 1.3, provided that the composition comprises substantially no hydrophilic polymer;

(3) The photosensitive resin composition according to the above (1) or (2), wherein the thermoplastic elastomer (A) has a block comprising styrene as a main component and a block comprising at least butadiene as a main component;

(4) The photosensitive resin composition according to the above (1) or (2), wherein the polymer (B) has a number-average molecular weight of not less than 20,000 and not more than 60,000;

(5) The photosensitive resin composition according to the above (1) or (2), wherein the polymer (B) has a number-average molecular weight of not less than 26,000 and not more than 60,000;

(6) The photosensitive resin composition according to the above (1), wherein the polymer (B) has a ratio of a weight-average molecular weight to a number-average molecular weight thereof of not more than 1.3;

(7) The photosensitive resin composition according to any one of the above (1) to (5), wherein tan δ of a cured product of the resin composition in a dynamic viscoelasticity measurement has two peaks in a range of −90° C. to 10° C.;

(8) A photosensitive structure for flexography, comprising a lamination structure comprising a support and a layer of a photosensitive resin composition according to any one of the above (1) to (6) formed on a surface of the support;

(9) A method for manufacturing a photosensitive resin composition according to the above (1), comprising the steps of: supplying a thermoplastic elastomer (A) to a first section of an extruder; then supplying a polymer (B) comprising butadiene as a main component wherein the polymer (B) has a number-average molecular weight of not less than 10,000 and not more than 60,000 and a 1,2-vinyl content based on the total amounts of double bonds in the polymer (B) of not more than 25%, a photopolymerizable unsaturated monomer (C) and a photopolymerization initiator (D) to one or more supply openings in a heated section following the first section; and kneading the mixture;

(10) A method for manufacturing a photosensitive resin composition according to the above (2), comprising the steps of: supplying a thermoplastic elastomer (A) to a first section of an extruder; then supplying a polymer (B) comprising butadiene as a main component wherein the polymer (B) has a number-average molecular weight of not less than 10,000 and not more than 60,000 and a ratio of the weight-average molecular weight to the number-average molecular weight of not more than 1.3, a photopolymerizable unsaturated monomer (C) and a photopolymerization initiator (D) to one or more supply openings in a heated section following the first section; and kneading the mixture;

(11) The method according to the above (9) or (10), wherein the heated section following the first section has at least two supply openings and wherein 10 to 40% of the polymer (B) comprising butadiene as a main component, the photopolymerizable unsaturated monomer (C) and the photopolymerization initiator (D) is charged to the first supply opening and the remainder of the components is charged to the second and succeeding supply openings following the first supply opening;

(12) A method for manufacturing a photosensitive resin structure according to the above (7), comprising the steps of: mixing a thermoplastic elastomer (A), a polymer (B) comprising butadiene as a main component, wherein the polymer (B) has a number-average molecular weight of not less than 10,000 and not more than 60,000 and a 1,2-vinyl content based on the amount of total double bonds in the polymer (B) of not more than 25%, a photopolymerizable unsaturated monomer (C) and a photopolymerization initiator (D); and molding the mixture lamellarly on a support; and

(13) A method for manufacturing a photosensitive resin composition according to the above (2), comprising the steps of: mixing a thermoplastic elastomer (A), a polymer (B) comprising butadiene as a main component wherein the polymer (B) has a number-average molecular weight of not less than 10,000 and not more than 60,000 and a ratio of the weight-average molecular weight to the number-average molecular weight of not more than 1.3, a photopolymerizable unsaturated monomer (C) and a photopolymerization initiator (D); and molding the mixture lamellarly on a support.

Advantages of the Invention

The photosensitive resin composition of the present invention simultaneously satisfies the cold flow resistance (shape maintenability) of photosensitive resin structures and a high image reproducibility and a high printing durability of printing plates.

BEST MODE FOR CARRYING OUT THE INVENTION

Hereinafter, the present invention will be specifically described centered on especially preferable modes.

The photosensitive resin composition of the present invention contains, at least, a thermoplastic elastomer (A), a polymer comprising butadiene as a main component (B), a photopolymerizable unsaturated monomer (C) and a photopolymerization initiator (D), provided that the composition contains substantially no hydrophilic polymer.

The hydrophilic polymer as described in the present invention means one which has a hydrophilic functional group, is solid at ordinary temperatures and has no fluidity, dissolves or swells in water at ordinary temperatures, and is not compatible with the thermoplastic elastomer (A) of the present invention.

"Comprising (containing) substantially no hydrophilic polymer" as described in the present invention indicates that the amount of a hydrophilic polymer in a photosensitive resin composition is not more than 3 wt. %. By setting the amount of a hydrophilic polymer to be not more than 3 wt. %, a high printing durability in printing using a solvent ink containing esters is obtained. The amount of a hydrophilic polymer is more preferably not more than 1 wt. %, and most preferably not contained.

The thermoplastic elastomer (A) of the present invention is preferably a thermoplastic block copolymer which exhibits the rubber elasticity nearly at ordinary temperatures, hardly deforms plastically, and is easily plasticized by heat when the composition is mixed by an extruder, etc.

The content of the thermoplastic elastomer (A) of a photosensitive resin composition is preferably not less than 40 wt.

% for improving the mechanical strength of printing plates and not more than 90 wt. % for making the composition of a low viscosity to make the mixing of the resin composition easy.

The thermoplastic elastomer (A) is, in view of availability, preferably a styrenic thermoplastic elastomer composed of a block comprising styrene as a main component and a block comprising at least a conjugated diene. The block structure is not especially limited.

The conjugated diene species of the styrenic thermoplastic elastomer is, in view of economical efficiency, preferably butadiene and/or isoprene. Among them, in view of printing durability, one containing butadiene is more preferable.

Further, the styrene content of the styrenic thermoplastic elastomer is preferably not less than 10 wt. % in view of suppressing the cold flow when photosensitive resin plates before exposure are stacked or otherwise treated, and preferably not more than 40 wt. % for enhancing the flexibility of printing plates. From 13 wt. % to not more than 28 wt. % is more preferable.

The polymer (B) essential in the present invention is a polymer comprising butadiene as a main component and having a number-average molecular weight in the range of not less than 10,000 and not more than 60,000.

The polymer (B) can provide a favorable image reproducibility and printing durability by containing butadiene as a main component.

"Main component" as described in the present invention means a ratio of not less than 70 wt. %. It is preferably not less than 85 wt. %, further preferably not less than 95 wt. %. As long as butadiene is a main component, it may be a copolymer with styrene or isoprene. Further, it may be partially hydrogenated. The structure, cis/trans ratio or polymerization method is not especially limited.

The polymer (B) has preferably fluidity at ordinary temperatures to facilitate mixing of a photosensitive resin composition.

With Mn of not less than 10,000, the cold flow resistance and printing durability are better; and with that of not more than 60,000, a better development rate can be maintained. It is preferably in the range of 20,000 to 60,000, further preferably 26,000 to 60,000.

The content of the polymer (B) in a photosensitive resin composition is, from the viewpoint of improving the printing durability and flexibility of printing plates, preferably not less than 3 wt. %, and from the viewpoint of the decrease in tackiness of the printing plate surface, preferably not more than 40 wt. %. It is more preferably in the range of 5 wt. % to 35 wt. %, further preferably 10 wt. % to 35 wt. %.

Additionally, from the viewpoint of the printing durability and image reproducibility, the 1,2-vinyl content based on the amount of double bonds in the polymer (B) is preferably not more than 25%. It is more preferably not more than 15%.

Moreover, from the viewpoint of the image reproducibility and printing durability, the ratio (Mw/Mn) of the weight-average molecular weight (Mw) to the number-average molecular weight (Mn) is preferably not more than 1.3. It is more preferably not more than 1.2.

Further, from the viewpoint of the printing durability, the tan δ of a cured product of the resin composition in the dynamic viscoelasticity measurement is preferably in the temperature range of −90° C. to 10° C., and has, at least, a large peak at a lower-temperature side and a smaller peak than that at a higher-temperature side.

The peak at a higher-temperature side has a tendency of becoming larger as the content of the polymer (B) of the present invention is higher. The content of the polymer (B) of butadiene in a photosensitive resin composition is preferably not less than 5 wt. %, further preferably not less than 10 wt. %.

The measurement method of the dynamic viscoelasticity involves first press-molding a resin composition into a thickness of 3 mm with silicone PET on both sides thereof, and exposing the whole surfaces from both surfaces each with 3,000 mJ/$cm^2$ using an ultraviolet fluorescent lamp having a center wavelength of 370 nm on an exposure machine AFP-1216 (trade name; manufactured by Asahi Kasei Corp.) to obtain a cured product of the resin composition. The exposure intensity is measured by a UV luminometer (trade name: MO-2), manufactured by ORC Manufacturing Co., Ltd., using a filter UV-35 (trade name; manufactured by ORC Manufacturing Co., Ltd.).

Then, the cured product is cut into 10 mm in width, and set on an instrument AR-500 (trade name; manufactured by TA Instruments) in the torsion type geometry in a sample length of 4 mm, and measured at a strain of 0.05%, a frequency of 1 Hz and a temperature-rising rate of 5.0° C./min from −100° C. to +40° C. to obtain a graph of a variable, tan δ, vs. temperature. From the obtained graph, the presence and the position of peaks on a lower-temperature side and a higher-temperature side can be judged.

The molecular weight of the present invention is a value determined in terms of polystyrene using gel permeation chromatography (GPC). Specifically, it is analyzed and calculated using an RI detector of HLC-8020 (GPC manufactured by Tosoh Corp.; trade name; column: TSK-GEL-GM-HXL).

The 1,2-vinyl content is calculated from a peak ratio of the proton NMR (magnetic resonance spectrometry) of the liquid polybutadiene.

The photopolymerizable unsaturated monomer (C) as described in the present invention includes esters such as acrylate, methacrylate, fumarate and maleate, acrylamide and methacrylamide derivatives, allyl esters, styrene and its derivatives, and N-substituted maleimide compounds.

It specifically includes diacrylates and dimethacrylates of alkanediols such as hexanediol or nonanediol, diacrylates and dimethacrylates of ethylene glycol, diethylene glycol, propyrene glycol, dipropyrene glycol, polyethylene glycol and butylene glycol, trimethylolpropane (meth)acrylate, dimethyloltricyclodecane di(meth)acrylate, isoboronyl (meth) acrylate, lauryl(meth)acrylate, phenoxypolyethylene glycol (meth)acrylate, pentaerythrit tetra(meth)acrylate, N,N'-hexamethylenebisacrylamide and methacrylamide, styrene, vinyltoluene, divinylbenzene, diacryl phthalate, triacyl cyanurate, diethyl fumarate, dibutyl fumarate, dioctyl fumarate, distearyl fumarate, butyl octyl fumarate, diphenyl fumarate, dibenzyl fumarate, dibutyl maleate, dioctyl maleate, bis(3-phenylpropyl) fumarate, dilauryl fumarate, dibehenyl fumarate and N-laurylmaleimide. These may be used singly or in a combination of two or more.

When the content of the photopolymerizable unsaturated monomer (C) is too low, the formability of fine points and characters decreases; and when it is too high, the cold flow resistance when photosensitive resin plates before exposure are stacked decreases, and the flexibility of printing plates also decreases; so the content of the photopolymerizable unsaturated monomer (C) is preferably in the range of 0.5 wt. % to 30 wt. % in the photosensitive resin composition, more preferably 1 wt. % to 15 wt. %.

The photopolymerization initiator (D) as described in the present invention means a compound which absorbs the light energy and generates radicals; well-known various kinds thereof are usable; and various kinds of organic carbonyl compounds, especially aromatic carbonyl compounds are suitable.

It specifically includes benzophenone, 4,4-bis(diethylamino)benzophenone, t-butylanthraquinone, 2-ethylanthraquinone, thioxanthones such as 2,4-diethylthioxanthone, isopropylthioxanthone and 2,4-dichlorothioxanthone, acetophenones such as diethoxyacetophenone, 2-hydroxy-2-methyl-1-phenylpropane-1-one, benzyl dimethyl ketal, 1-hydroxycyclohexyl phenyl ketone, 2-methyl-2-morpholino(4-thiomethylphenyl)propane-1-one and 2-benzyl-2-dimethylamino-1-(4-morpholinophenyl)-butanone, benzoin ethers such as benzoin methyl ether, benzoin ethyl ether, benzoin isopropyl ether and benzoin isobutyl ether, acylphosphine oxides such as 2,4,6-trimethylbenzoil diphenyl phosphine oxide, bis(2,6-dimethoxybenzoil)-2,4,4-trimethyl pentyl phosphine oxide and bis(2,4,6-trimethylbenzoil)-phenyl phosphine oxide, methylbenzoyl formate, 1,7-bisacridinylheptane, and 9-phenylacridine. These may be used singly or in a combination of two or more.

When the content of the photopolymerization initiator (D) is too low, the formability of fine points and characters decreases; and when it is too high, the transmissivity of active rays such as ultraviolet rays decreases; so the content of the photopolymerization initiator (D) is preferably in the range of 0.1 wt. % to 10 wt. % in the photosensitive resin composition, more preferably 0.5 wt. % to 5 wt. %.

Other than the above-mentioned essential components for the photosensitive resin composition of the present invention, various auxiliary additive components can optionally be added, such as a plasticizer, thermal polymerization inhibitor, antioxidant, ultraviolet absorbent, antihalation agent and photostabilizer.

The plasticizer includes a hydrocarbon such as a naphthene or paraffin, a liquid polybutadiene of a low number-average molecular weight, a liquid poyisoprene, a modified liquid polybutadiene, a liquid acrylonitrile-butadiene copolymer, a liquid styrene-butadiene copolymer, a polystyrene of a number-average molecular weight of not more than 2,000, a sebacate, and a phthalate. A photopolymerizable reaction group may be attached to these copolymers.

The photosensitive resin structure for flexography of the present invention can be prepared by various methods. A method, for example, involves dissolving and mixing raw materials of a photosensitive resin composition in a suitable solvent, for example, chloroform, tetrachloroethylene, methyl ethyl ketone and toluene, casting the solution in a mold and evaporating the solvent to obtain a plate as it is. Alternatively, without using a solvent, it involves kneading them in a screw extruder, a kneader, or a roll mill, and molding the mixture into a prescribed thickness by a calender roll, a press or the like, but the present invention is not limited to these preparation methods.

An example of a method to continuously obtain a photosensitive resin by an extrusion molding involves weighing and supplying at least one thermoplastic elastomer, at least one photopolymerizable unsaturated monomer and at least one photopolymerization initiator into a self-cleaning type two-screw extruder, melting and degassing therein, and then passing through a sheet die and transporting to two calender rolls for molding. Then, the thermoplastic elastomer is weighed and supplied to a preferably unheated first section of the extruder, and a liquid component in which the components other than the thermoplastic elastomer are mixed and dissolved is weighed and supplied to one or more supply openings of a heated section following the first section to melt the mixture. When the liquid component is supplied from two or more supply openings, it is preferable that 10 to 40% of the whole be charged to a first supply opening and the remainder liquid component be charged to second and succeeding supply openings following the first.

Since a photosensitive resin composition generally has tackiness, for achieving an improved contact with a negative film overlapped thereon in platemaking, or for enabling reuse of the negative film, a solvent-soluble thin flexible protection layer (e.g., see JP-B-05-13305) may be provided on the resin layer surface. The flexible protection layer may be an ultraviolet blocking layer containing an infrared sensitive substance, and the flexible protection layer itself may be used as a negative film by direct drawing with an infrared laser. In either case, when the unexposed part is washed out after the exposure has completed, the thin flexible protection layer is also simultaneously removed.

When as a solvent-soluble thin flexible protection layer, for example, a layer of a polyamide soluble in a washing-out liquid, a partially saponified polyvinyl acetate, a cellulose ester or the like is provided on the surface of a photosensitive resin layer, a solution in which the polyamide, etc. is dissolved in a suitable solvent may be coated directly on the photosensitive resin layer. Alternatively, the solution may be coated on a film such as polyester or polypropylene (protection film), and thereafter, the protection layer is transferred by laminating or press-bonding the protection film on the photosensitive layer.

In general, by adhering a protective film and a support to a photosensitive resin composition by roll-lamination after sheet molding of the photosensitive resin composition, and heat-pressing after the lamination, a photosensitive resin layer having a much more highly precise thickness can be obtained.

For making flexographic printing plates from a photosensitive resin structure for flexographic printing plates, it is common that: first the ultraviolet exposure is conducted on the whole surface through a support (back exposure) to provide a thin uniform cured layer; the image exposure (relief exposure) is conducted on the surface of a photosensitive resin layer through a negative film or directly from above an ultraviolet blocking layer; unexposed parts are washed out with a developing solvent, or absorbed and removed in an absorbing layer after heating and melting; and the post-exposure is conducted.

Either of the exposure (relief exposure) from the negative film side and the exposure (back exposure) from the support side may be first conducted, or both of them may be simultaneously conducted.

An exposure light source includes a high pressure mercury lamp, an ultraviolet fluorescent lamp, a carbon arc lamp and a xenon lamp.

A developing solvent to be used to develop unexposed parts includes esters such as heptyl acetate and 3-methoxybutyl acetate, hydrocarbons such as a petroleum fraction, toluene and decalin, and a chlorine-based organic solvent such as tetrachloroethylene mixed with an alcohol such as propanol, butanol or pentanol.

Washing-out of unexposed parts can be conducted by injection from a nozzle or brushing by a brush.

As the post-exposure, a method in which light of not more than 300 nm in wavelength is irradiated on the surface is commonly used. Light of more than 300 nm may optionally be used therewith.

Hereinafter, the present invention will specifically be described by way of Reference Examples, Examples and Comparative Examples, but is not limited to these examples.

REFERENCE EXAMPLES

(1) Fabrication of Photosensitive Resin Compositions and Photosensitive Resin Structures A photosensitive resin formulation shown in Table 1 was mixed by a kneader at 140° C. for 40 min to obtain a photosensitive resin composition.

The obtained photosensitive resin composition was interposed between a polyester film support of 125 μm in thickness on which an adhesive containing a thermoplastic elastomer was coated and a polyester cover sheet of 100 μm having a polyamide layer of 4 μm in thickness, and pressed using a 3-mm spacer by a pressing machine under condition of 130° C. at a pressure of 200 kg/cm² spending 4 min to mold a photosensitive resin structure for flexographic printing plates.

photosensitive resin layer; and exposure was conducted on the whole surface at 300 mJ/cm² from the support side (back exposure) using an ultraviolet fluorescent lamp having a center wavelength of 370 nm on an exposing machine AFP-1500 (trade name, manufactured by Asahi Kasei Chemicals Corp.), and successively, image-exposure (relief exposure) was conducted at 6,000 mJ/cm² through the negative film.

The exposure intensity at this time obtained by measuring the ultraviolet rays from a lamp on the lower side, where the back exposure was conducted, on a glass plate using a filter UV-35 by a UV luminometer MO-2, manufactured by ORC Manufacturing Co., Ltd., was 10.3 mW/cm²; and the intensity of the ultraviolet rays from a lamp on the upper side, where the relief exposure was conducted, was 12.5 mW/cm².

Then, the obtained plate was attached with a double-sided adhesive tape on a rotating cylinder of a developing machine

TABLE 1

| Photosensitive resin formulation (wt %) | | | | Example 1 | Comparative Example 1 | Comparative Example 2 | Example 2 | Comparative Example 3 | Comparative Example 4 |
|---|---|---|---|---|---|---|---|---|---|
| Thermoplastic elastomer (A) | | | | | | | | | |
| KX-405 (trade name, manufactured by Kraton Polymers LLC.) | | | | 54 | 54 | 54 | 35 | 35 | 35 |
| TUFPRENE 315 (trade name, manufactured by Asahi Kasei Chemicals Corp.) | | | | | | | 33 | 33 | 33 |
| | Mn (10,000) | Mw/Mn | 1,2-vinyl | | | | | | |
| Polybutadiene | | | | | | | | | |
| LIR-300 | 4.6 | 1.1 | 9% | 10 | | | | | |
| LIR-305 | 2.8 | 1.1 | 9% | | | | 10 | | |
| B-2000 | 0.3 | 3.0 | 71% | | 10 | | | 10 | |
| B-3000 | 0.6 | 1.3 | 90% | | | | 15 | 15 | 15 |
| Polyisoprene | | | | | | | | | |
| LIR-50 | 4.7 | 1.1 | 7% | | | 10 | | | |
| LIR-30 | 2.9 | 1.2 | 7% | | | | | | 10 |
| Hydrocarbon | SMOIL P350 | | | 30 | 30 | 30 | | | |
| Photopolymerizable unsaturated monomer (C) | Monomer A | | | 3 | 3 | 3 | 4 | 4 | 4 |
| Photopolymerization initiator (D) | Initiator I | | | 2 | 2 | 2 | 2 | 2 | 2 |
| Stabilizer | BHT | | | 1 | 1 | 1 | 1 | 1 | 1 |
| Evaluation result | | | | | | | | | |
| (a) Cold flow resistance | | | | 1.3% | 7.0% | 1.4% | 1.6% | 5.7% | 1.6% |
| (b) Printing plate reproducibility | Fine line shoulder shape *3 | | | ○ | ○ | X | ○ | ○ | X |
| | Reverse line depth (μm) (deeper is better) | | | 261 | 257 | 150 | 192 | 185 | 102 |
| (c) Printing durability | Printing test *1 | | | ○ | X | X | ○ | X | X |
| | NP-type printing durability tester *2 | | | ○ | X | X | ○ | X | X |

*LIR-300, 305, 50, 30 (trade name, manufactured by Kuraray Co., Ltd.)
*B-2000 (trade name, manufactured by Nippon Petrochemicals Co., Ltd.)
*B-3000 (trade name, manufactured by Nippon Soda Co., Ltd.)
*SMOIL 350 (trade name, manufactured by Matsumura Oil Co., Ltd.)
*Monomer A: alkanediol diacrylate (carbon number of the alkanediol is 14 to 16)
*Initiator I: 2,2-dimethoxy-1,2-diphenylethane-1-one
*Stabilizer BHT: 2,6-di-t-butyl-p-cresol
*1Printing quality after finish. O (good): Favorable printing quality maintained. X( poor): Character parts worn and chipped.
*2Result of observation by a microscope of a chippin "g-off state after scrubbing of 100 times of character parts and halftone parts with a cloth as contacting body under a load of 1 kg. O (good): No occurrence of chipping-off X (poor): Occurence of chipping-off.
*3Result of visual evaluation by a microscope of a shoulder shape from the side of the cross-section formed by cutting lines of 100 μm in width on a printing plate cut. O (good): Sharp and favorable shape, X (poor): Not favorable shape.

(2) Fabrication of Flexographic Printing Plates

The cover sheet of the photosensitive resin structure for flexographic printing plates in (1) was peeled off; a negative film was adhered on the polyamide protection layer on the AFP-1500 (trade name, manufactured by Asahi Kasei Chemicals Corp.) using 3-methoxybutyl acetate as a developing solution, subjected to development at a liquid temperature of 25° C. for 5 min, and dried at 60° C. for 2 h. Thereafter, as the post-exposure, the whole surface of the plate was exposed at 2,000 mJ/cm² using a germicidal lamp having a center wavelength of 254 nm, and successively exposed at 1,000 mJ/cm² using an ultraviolet fluorescent lamp to obtain a flexographic printing plate. Here, the postexposure light amount by the germicidal lamp was calculated from the illuminance measured using a UV-25 filter of the MO-2 machine.

(3) Evaluation Method (a) Cold Flow Resistance

An uncured photosensitive resin structure obtained in Reference Example 1 was cut out in 5 cm×5 cm; with a load of 28 g/cm² applied on the whole surface, the cut-out resin structure was allowed to stand at an atmosphere of 40° C. for 24 h; and then the change in the thickness was measured.

Since if the thickness reduction rate (cold flow) of the photosensitive resin structures exceeds 2.0%, the plates when preserved or transported are deformed and highly possibly become unusable, that of less than 2.0% was defined as passing.

(b) Image Reproducibility (Fine Line Shoulder Shape and Reverse Line Depth)

The cross-sectional shape of convex lines of 100 μm in width on the printing plate obtained in Reference Example 2 and the depth of concave lines of 500 μm in width were measured. Since the faithfulness to the negative film, and less thickened convex lines and less filled-up concave lines in printed matters are better, a shoulder shape of convex lines assuming a sharp one in visual evaluation using a microscope was considered to be favorable and marked as ○ (good) Since a deeper depth of concave lines is better, the depth of not less than 150 μm was defined as passing.

(c) Printing Durability (c-1) Printing Durability During Printing

In the case of the printing plates of Example 1, Comparative Example 1 and Comparative Example 2 obtained in Reference Example 2, printing of 10,000 sheets was conducted using as a water-based ink New-FK-NP10 (trade name, manufactured by Sakata Inx Corp.) and using a corrugated board sheet as a substrate; on the other hand, in the case of the printing plates of Example 2, Comparative Example 3 and Comparative Example 4 obtained in Reference Example 2, printing of 10,000 m was conducted using as an ink containing an ester solvent XS-716 (trade name, manufactured by Dainippon Ink and Chemicals, Ltd.) and using a low density polyethylene (thickness: 0.04 mm) as a substrate. Favorably maintained printing quality was considered to be better, and marked as ○ (good). The case of character parts being worn and chipped was considered to be worse, and marked as × (poor)

(c-2) Plate Wiping Resistance

Although ink accumulated on the plate surface of printing plates are removed using a cloth, etc. during printing or at the time of printing finish, the printing plates cannot sometimes be not used for a long time due to chipping and otherwise of character parts and halftone parts during the removing. For mimically evaluating this, a chipping-off state after scrubbing of 100 times of character parts and halftone parts using an NP-type printing durability tester (manufactured by Niimura Printing Co., Ltd., contacting body: cloth, load: 1 kg) was observed by a microscope. It was determined that no occurrence of chipping-off was considered to be better, and marked as ○ (good); and occurrence of chipping-off was considered to be worse, and marked as × (poor)

EXAMPLES

Example 1

The test result of the cold flow resistance of the photosensitive resin structure was as small as 1.3%, revealing that there was no risk of occurrence of the plate deformation.

The shoulder of convex lines in the image reproducibility evaluation had a favorable shape and the depth of concave lines thereof was 261 μm, showing a favorable reproducibility; and also with respect to corrugated board printing, a printed matter having favorable convex lines as well as favorable concave lines was obtained.

In the corrugated board printing test of the photosensitive resin plate for flexography, a favorable printing quality was maintained even in a long time printing with no chipping-off of the cured resin layer.

Further, in the evaluation by the NP-type printing durability tester, no chipping-off of character parts and halftone parts was observed.

Comparative Example 1

A photosensitive resin structure and a printing plate were obtained and evaluated as in Example 1, but replacing totally the liquid polybutadiene in Example 1 with a liquid polybutadiene B-2000 (trade name, manufactured by Nippon Petrochemicals Co., Ltd.; molecular weight: 3,400, 1,2-vinyl content: 71%). The result is shown in Table 1.

Comparative Example 2

A photosensitive resin structure and a printing plate were obtained and evaluated as in Example 1, but replacing totally the liquid polybutadiene in Example 1 with a liquid polyisoprene LIR-50 (trade name, manufactured by Kuraray Co., Ltd.; molecular weight: 47,000, 1,2-vinyl content: 7%). The result is shown in Table 1.

Example 2

The cold flow resistance, the image reproducibility and the printing durability of a photosensitive resin structure were evaluated as in Example 1, but changing the photosensitive resin formulations as shown in Table 1. The result is shown in Table 1.

All of the cold flow resistance, the image reproducibility and the printing durability of the photosensitive resin structure show favorable results. Further, all of convex line parts, concave line parts and halftone parts show favorable printing results.

Comparative Example 3

A photosensitive resin structure and a printing plate were obtained and evaluated as in Example 2, but replacing totally the liquid polybutadiene in Example 2, LIR-305 (trade name, manufactured by Kuraray Co., Ltd.; molecular weight: 28,000, 1,2-vinyl content: 9%) with a liquid polybutadiene B-2000 (trade name, manufactured by Nippon Petrochemicals Co., Ltd.; molecular weight: 3,400, 1,2-vinyl content: 71%). The result is shown in Table 1.

Comparative Example 4

A photosensitive resin plate was obtained and evaluated as in Example 2, but replacing totally a liquid polybutadiene in Example 2, LIR-305 (trade name, manufactured by Kuraray Co., Ltd.; molecular weight: 28,000, 1,2-vinyl content: 9%) with a liquid polyisoprene LIR-30 (trade name, manufactured by Kuraray Co., Ltd.; molecular weight: 29,000, 1,2-vinyl content: 7%). The result is shown in Table 1.

As is clear from Table 1, Examples 1 and 2 containing a polymer comprising butadiene as a main component of 10,000 to 60,000 in number-average molecular weight can satisfy both the favorable cold flow resistance and the excellent image reproducibility and high printing durability of the photosensitive resin structures.

INDUSTRIAL APPLICABILITY

The photosensitive resin composition for flexography of the present invention is suitable for obtaining printed matters which have a small change in the thickness during transportation of the photosensitive resin structure, an excellent image reproducibility, a favorable printing durability, and a low convex line thickening and little concave line filling-up.

The invention claimed is:

1. A photosensitive resin composition for flexography, comprising a thermoplastic elastomer (A), a polymer (B) comprising butadiene as a component in a ratio of not less than 95 wt. %, a photopolymerizable unsaturated monomer (C) and a photopolymerization initiator (D), wherein the polymer (B) has a number-average molecular weight of not less than 10,000 and not more than 60,000 and a 1,2-vinyl content based on the total amount of double bonds in the polymer (B) of not more than 15%, provided that said composition comprises a hydrophilic polymer of not more than 3 wt. %.

2. A photosensitive resin composition for flexography, comprising a thermoplastic elastomer (A), a polymer (B) comprising butadiene as a component in a ratio of not less than 95 wt. %, a photopolymerizable unsaturated monomer (C) and a photopolymerization initiator (D), wherein the polymer (B) has a number-average molecular weight of not less than 10,000 and not more than 60,000, and a ratio of a weight-average molecular weight to a number-average molecular weight thereof of not more than 1.3, provided that the composition comprises a hydrophilic polymer of not more than 3 wt. %.

3. The photosensitive resin composition according to claim 1 or 2, wherein the thermoplastic elastomer (A) comprises a block comprising styrene as a main component and a block comprising at least butadiene as a main component.

4. The photosensitive resin composition according to claim 1 or 2, wherein the polymer (B) has a number-average molecular weight of not less than 20,000 and not more than 60,000.

5. The photosensitive resin composition according to claim 1 or 2, wherein the polymer (B) has a number-average molecular weight of not less than 26,000 and not more than 60,000.

6. The photosensitive resin composition according to claim 1, wherein the polymer (B) has a ratio of a weight-average molecular weight to a number-average molecular weight thereof of not more than 1.3.

7. The photosensitive resin composition according to claim 1 or 2 wherein tan δ of a cured product of the resin composition in a dynamic viscoelasticity measurement has two peaks in a range of −90° C. to 10° C.

8. A photosensitive resin structure for flexography, comprising a lamination structure comprising a support and a layer of a photosensitive resin composition according to claim 1 or 2 formed on a surface of the support.

9. A method for manufacturing a photosensitive resin composition according to claim 1, comprising the steps of: supplying a thermoplastic elastomer (A) to a first section of an extruder; then supplying a polymer (B) comprising butadiene as a component in a ratio of not less than 95 wt. %, wherein the polymer (B) has a number-average molecular weight of not less than 10,000 and not more than 60,000 and a 1,2-vinyl content based on the total amount of double bonds in the polymer (B) of not more than 15%, a photopolymerizable unsaturated monomer (C) and a photopolymerization initiator (D) to one or more supply openings in a heated section following the first section; and kneading the mixture.

10. A method for manufacturing a photosensitive resin composition according to claim 2, comprising the steps of: supplying a thermoplastic elastomer (A) to a first section of an extruder; then supplying a polymer (B) comprising butadiene as a component in a ratio of not less than 95 wt. %, wherein the polymer (B) has a number-average molecular weight of not less than 10,000 and not more than 60,000 and a ratio of the weight-average molecular weight to the number-average molecular weight of not more than 1.3, a photopolymerizable unsaturated monomer (C) and a photopolymerization initiator (D) to one or more supply openings in a heated section following the first section; and kneading the mixture.

11. The method according to claim 9 or 10, wherein the heated section following the first section has at least two supply openings and wherein 10 to 40% of the polymer (B) comprising butadiene as a component in a ratio of not less than 95 wt. %, the photopolymerizable unsaturated monomer (C) and the photopolymerization initiator (D) is charged to the first supply opening and the remainder of the components is charged to the second and succeeding supply openings following the first supply opening.

12. A method for manufacturing photosensitive resin structure according to claim 8, comprising the steps of: mixing a thermoplastic elastomer (A), a polymer (B) comprising butadiene as a component in a ratio of not less than 95 wt. %, wherein the polymer (B) has a number-average molecular weight of not less than 10,000 and not more than 60,000 and a 1,2-vinyl content based on the total amount of double bonds in the polymer (B) of not more than 15%, a photopolymerizable unsaturated monomer (C) and a photopolymerization initiator (D); and molding the mixture lamellarly on a support.

13. A method for manufacturing a photosensitive resin structure according to claim 8, comprising the steps of: mixing a thermoplastic elastomer (A), a polymer (B) comprising butadiene as a component in a ratio of not less than 95 wt. %, wherein the polymer (B) has a number-average molecular weight of not less than 10,000 and not more than 60,000 and a ratio of the weight-average molecular weight to the number-average molecular weight of not more than 1.3, a photopolymerizable unsaturated monomer (C) and a photopolymerization initiator (D); and molding the mixture lamellarly on a support.

* * * * *